US012595778B2

(12) United States Patent
Guo et al.

(10) Patent No.: US 12,595,778 B2
(45) Date of Patent: Apr. 7, 2026

(54) METHOD AND SYSTEM FOR OPTIMIZING OPERATING SWING OF VERTICAL SHAFT SUSPENDED HYDROGENERATOR UNIT

(71) Applicants:Yunnan UNITED POWER Development Co., Ltd., Kunming (CN); Huaneng Lancang River Hydropower Inc, Kunming (CN)

(72) Inventors: Hong'e Guo, Kunming (CN); Youde Luo, Kunming (CN); Wenbin Wang, Kunming (CN); Zhengtang Ji, Kunming (CN); Qiang Yang, Kunming (CN); Junchao Li, Kunming (CN); Yunjiang Lu, Kunming (CN); Dinghong Gu, Kunming (CN); Xinxing Wang, Kunming (CN)

(73) Assignees: Yunnan UNITED POWER Development Co., Ltd., Kunming (CN); Huaneng Lancang River Hydropower Inc, Kunming (CN)

( * ) Notice: Subject to any disclaimer, the term of this patent is extended or adjusted under 35 U.S.C. 154(b) by 367 days.

(21) Appl. No.: 18/465,761

(22) Filed: Sep. 12, 2023

(65) Prior Publication Data

US 2025/0084820 A1 Mar. 13, 2025

(30) Foreign Application Priority Data

Sep. 15, 2022 (CN) .......................... 202211123266.6

(51) Int. Cl.
F03B 13/08 (2006.01)
F03B 7/00 (2006.01)
(Continued)

(52) U.S. Cl.
CPC ................ F03B 13/08 (2013.01); F03B 7/00 (2013.01); F03B 11/06 (2013.01); G06F 30/17 (2020.01);
(Continued)

(58) Field of Classification Search
CPC .. F03B 13/08; F03B 7/00; F03B 11/06; G06F 30/17; F05B 2220/32; F05B 2260/83; F05B 2260/84
See application file for complete search history.

(56) References Cited

U.S. PATENT DOCUMENTS

| | | | | | |
|---|---|---|---|---|---|
| 5,263,261 | A | * | 11/1993 | Piety | ........................ G01B 7/31 33/645 |
| 5,798,572 | A | * | 8/1998 | Lehoczky | ............. F03B 17/061 290/43 |
| 2012/0064756 | A1 | * | 3/2012 | Hachuda | .............. G01R 1/0466 384/154 |

* cited by examiner

*Primary Examiner* — Gertrude Arthur Jeanglaude

(57) ABSTRACT

A method and a system for optimizing operating swing of a vertical shaft suspended hydrogenerator unit, and the method includes: measure turning swing and operating parameters of the unit during turning, calculate direction of relative displacement between the rotating center of each bearing for the unit and a center line of a main shaft, and calculate and adjust offset distance of an installation center for a guide bearing to a certain direction by the temperature of a bearing bush; then carry out a temperature rise test of the unit, optimize the operating swing of the hydrogenerator unit while the bush temperature is less than the design requirement, and select optimal bush gap to achieve optimal operating swing and ensure that the bush temperature, the cooling oil level, the cooling oil temperature and the operating swing reach the most scientific and reasonable balanced state.

8 Claims, 4 Drawing Sheets

(51) Int. Cl.
    *F03B 11/06*       (2006.01)
    *G06F 30/17*       (2020.01)

(52) U.S. Cl.
    CPC ....... *F05B 2220/32* (2013.01); *F05B 2260/83*
             (2013.01); *F05B 2260/84* (2013.01)

METHOD AND SYSTEM FOR OPTIMIZING OPERATING SWING OF VERTICAL SHAFT SUSPENDED HYDROGENERATOR UNIT

CROSS-REFERENCE TO RELATED APPLICATIONS

This application claims priority of Chinese Patent Application No. 202211123266.6, filed on Sep. 15, 2022, the entire contents of which are incorporated herein by reference.

TECHNICAL FIELD

The invention relates to the technical field of hydropower production and operation, in particular to a method and a system for optimizing operating swing of a vertical shaft suspended hydrogenerator unit.

BACKGROUND ART

In reality, most of the time, the geometric center line of a circular rotating object does not coincide with the center line of rotation. If the rotating shaft is placed horizontally, you can see that the shaft jumps up and down when rotating; it the rotating shaft is placed vertically, you can see that the shaft sways from side to side, which reflects the deviation of the geometric center of the circular object from the center of rotation. The geometric center deviates from the center of rotation when the vertical shaft suspended hydrogenerator unit operates, and the specific value is called the swing value.

There are two types of swing for the vertical shaft suspended hydrogenerator unit: turning swing and operating swing.

Turning refers to turning the rotating part of the unit by the mechanical force (or electric power or manpower). To make the rotor not move horizontally when turning, it is necessary to limit the rotor to rotate in a certain position through a guide bearing bush (or temporary guide bearing bush). Generally, the guide bearing bush for the thrust bearing is helded, and other guide bearing bushes are loosened to try to turn the rotor. Obviously, the rotating center line is determined by the outer circle of the thrust collar during turning, and must be perpendicular to the working face of the thrust runner collar; however, due to poor manufacturing or installation, the geometric center line of the main shaft is not necessarily perpendicular to the working face of the thrust runner collar, or the flanges are eccentric during connection, which will cause the axis of other parts not to be in the rotating center line determined by the outer circle of the thrust collar, so the swing will appear. The measured value is called the turning swing.

In addition to the swing caused by the misalignment of the center line of the main shaft with the rotating center line, the rotating parts are also be affected by other forces generated during operation of the unit, such as the electromagnetic pull imbalance of the generator and the hydraulic imbalance of the hydroturbine. These forces also cause the center line of the rotating parts to deviate from the center of rotation, generating a swing. The swing caused by these factors is synchronized with the rotation period. In addition, when the rotating parts are rotating, the rotating center will not always be in a fixed position and will horizontally move due to the clearance of the guide bearing bush. It will also be reflected in the swing, but it is not necessarily synchronized with the rotation period. As the swing occurs in the operation of the unit, it is called the operating swing.

If there is no unbalanced external force after the unit operates, the axis movement can be the same as that during turning. However, after the actual operation of the unit, the stressed state of the rotating parts is completely different from that during turning, and there are actions of hydraulic, electromagnetic, centrifugal force and bearing binding forces. These forces are more or less unbalanced. In the case of the actions of unbalanced forces and an abnormal axis, the rotating part will have a phenomenon of continuous and alternating changes in the magnitude and direction relative to the rotating center, namely vibration ((if there is no law, it is shock). Therefore, when the unit operates, the swing measured at a certain part of the main shaft is vibration, which is completely different from the nature of the turning swing.

In addition to the manufacturing quality, the operating swing is also largely related to the installation quality, such as uneven air clearance of generator, uneven seal ring clearance of hydroturbine runner, dynamic unbalance of rotating parts, etc. The operating swing is the superposition of the turning swing and the swing caused by the unbalanced force. If the operating swing is too large, the expected maintenance effect of the unit cannot be reached, and it is also unfavorable to the safe and stable operation of the unit after maintenance.

CONTENT OF INVENTION

To solve the above problems, the invention provides a method and a system for optimizing operating swing of a vertical shaft suspended hydrogenerator unit, so that a rotating center of each bearing in the operation of the hydrogenerator is relatively close to a center line of a main shaft, thereby reducing the horizontal displacement of the rotating center of the unit during operation, increasing the binding force of the bearing bush to the rotating shaft, reducing the operating swing of the unit, and ensuring safer and more stable operation of the unit after maintenance.

The invention is realized by the following technical proposal:

A method for optimizing operating swing of a vertical shaft suspended hydrogenerator unit includes the following steps:

Step (1) Collect turning swing data of the unit before maintenance or restart the turning of the unit during maintenance and collect the data, and calculate the direction of relative displacement between the rotating center of each bearing for the unit and the center line of the main shaft;

Step (2) Remeasure installation clearance of each bearing bush during maintenance; in case of no change or small change, the structural strength of the bearing is considered to meet the design requirements, the installation is firm and reliable, and the implementation of the method is not affected. Make statistics on temperature of each bearing bush as well as oil level and temperature of the bearing before maintenance, adjust bush clearance during maintenance according to the design value, start the unit to perform a temperature rise test, and record the operating swing of the unit, the temperature of each bearing bush, the oil level and temperature of the bearing, and the temperature difference of the cooling water; calculate the margin of the design value for the operating temperature of the bearing bush through the comparison of the data before and after maintenance, and analyze whether the bush clearance can be reduced beyond the design range;

If feasible, set a target value of the operating temperature of the bearing bush, and reduce the clearance of each bearing bush according to the direction of the relative displacement between the rotating center of the bearing and the center line of the main shaft calculated in Step (1).

The clearance reduction of each bush is calculated by the computer processing system according to the weighted average of the clearance variation and temperature difference of the bush during maintenance and bush adjustment of all units.

Step (3) Carry out the temperature rise test of the unit again, record the operating swing of the unit and the temperature of each bearing bush, and correct the clearance of each bearing bush again according to the target value of the operating temperature of the bearing bush;

Step (4) Repeat Step (3) until the operating temperature of the bearing bush reaches the target value and the temperature deviation of the bearing bush does not exceed 5 degrees C.;

Step (5) Carry out a stability qualitative test of the unit, record the operating temperature of the bearing bush and the operating swing of the unit, compare the pre-maintenance data of the unit, and constantly optimize, so that the optimized value of the operating swing can reach the expected value and the operating temperature of the bearing bush can reach the target value.

Preferably, in Step (1), the collected data are pre-maintenance temperature of each bearing bush of each guide bearing and the bush clearance during installation.

Preferably, in Step (1), the axis adjustment accuracy of the unit is less than 0.01 mm/m when the unit is overhauled, far less than the national standard accuracy.

Preferably, in Step (2), the target value of the operating temperature of the bearing bush is set according to the standard requirements, including the design value safety redundancy and the operating procedure.

Preferably, in Step (5), if the optimized value of the operating swing does not reach the expected value, reduce the operating temperature of the bearing bush, and implement Step (3) again to make the optimized value of the operating swing reach the expected value and the operating temperature of the bearing bush reach the target value; the ways to reduce the operating temperature of the bearing bush include increasing the bearing oil level and increasing the cooling water flow.

Preferably, in Step (5), if the optimized value of the operating swing is degraded after the stability test of the unit is performed, such as the load dump test or overspeed test, implement Steps (3) and (4) again.

The invention also relates to a system for optimizing the operating swing of a vertical shaft suspended hydrogenerator unit, which comprises a data acquisition terminal, a processing terminal and an input terminal;

The acquisition terminal collects the turning swing data of the unit before maintenance, or collects the data when the turning of the unit is carried out again during maintenance, and the processing terminal calculates the direction of relative displacement between the rotating center of each bearing for the unit and the center line of the main shaft;

Remeasure the installation clearance of each bearing bush for the guide bearing during maintenance; after inputting through the input terminal, the processing terminal analyzes the change value of the bush clearance of the unit within an operating cycle; in case of no change value or if the change value is less than 0.01 mm, the structural strength of the bearing is judged to meet the design requirements, the installation is firm and reliable, and the implementation of the method is not affected. Make statistics on the temperature of each bearing bush and the oil level and temperature of the bearing before maintenance, adjust the bush clearance according to the design value, start the unit to perform the temperature rise test, and record the operating swing of the unit, the temperature of each bearing bush, the oil level and temperature of the bearing, and input through the input terminal; the processing terminal calculates the margin between the operating temperature of the bearing bush and the design value, and analyzes whether the bush clearance can be reduced beyond the design range;

If feasible, the target value of the operating temperature of the bearing bush is set through the input terminal, and the processing terminal reduces the clearance of each bearing bush according to the direction of relative displacement between the rotating center of the bearing and the center line of the main shaft analyzed according to Step (1), and the clearance reduction of each bush is calculated by the computer processing system according to the weighted average of the clearance variation and temperature difference of the bush during maintenance and bush adjustment of all units;

Carry out the temperature rise test of the unit again, input the operating swing of the unit and the temperature of each bearing bush through the input terminal, and correct the clearance of each bearing bush again according to the target value of the operating temperature of the bearing bush at the processing terminal, repeat until the operating temperature of the bearing bush reaches the target value and the temperature deviation of the bearing bush does not exceed 5 degrees C.;

Carry out the stability qualitative test of the unit, input the operating temperature of the bushing bush and the operating swing of the unit through the input terminal, and the processing terminal compares the pre-maintenance data of the unit and constantly optimizes, so that the optimized value of the operating swing can reach the expected value and the operating temperature of the bearing bush can reach the target value.

Preferably, the system also comprises a display terminal, which displays the final processing results.

The invention also relates to a computer system, which comprise a memory, a processor, and a computer program stored in the memory and capable of running on the processor, wherein the steps of the method are implemented when the processor executes the computer program.

The invention also relates to a non-transient computer-readable storage medium, on which a computer program is stored, and the steps of the method in claims 1 to 6 are implemented when the computer program is executed by the processor.

In Step (2) of the invention, analyze whether it is feasible to further reduce the bush clearance (beyond the design range). The final value of the bearing bush gap in Step (2) breaks through the design standard requirements.

In Step (1), after the unit is put into operation, the dynamic balance test of the hydrogenerator unit is completed, and the parameters meet the requirements of the relevant regulations. When the unit is overhauled, the adjustment precision of the unit axis is required to be improved and is increased to less than 0.01 mm/m based on the national standard of 0.02 mm/m.

It can be seen that the invention measures the turning swing of the unit and the unit parameters during operation, calculates the direction of relative displacement between the rotating center of each bearing of the unit and the center line of the main shaft, and calculates and adjusts the offset distance of the installation center of the guide bearing to a certain direction at the bush clearance according to the bearing bush temperature. Then, the invention carries out the temperature rise test of the unit, optimizes the operating swing of the hydrogenator unit while the bush temperature is less than the design requirement, and selects the optimal bush clearance through multiple adjustments to achieve the optimal operating swing and ensure that the bush temperature, the cooling oil level, the cooling oil temperature and the operating swing reach the most scientific and reasonable balanced state. The invention makes the rotating center of each bearing in the operation of the hydrogenator relatively close to the center line of the main shaft, thereby reducing the horizontal displacement of the rotating center of the unit during operation, increasing the binding force of the bearing bush to the rotating shaft, reducing the operating swing of the unit, and ensuring safer and more stable operation of the unit after maintenance.

Figure 1:
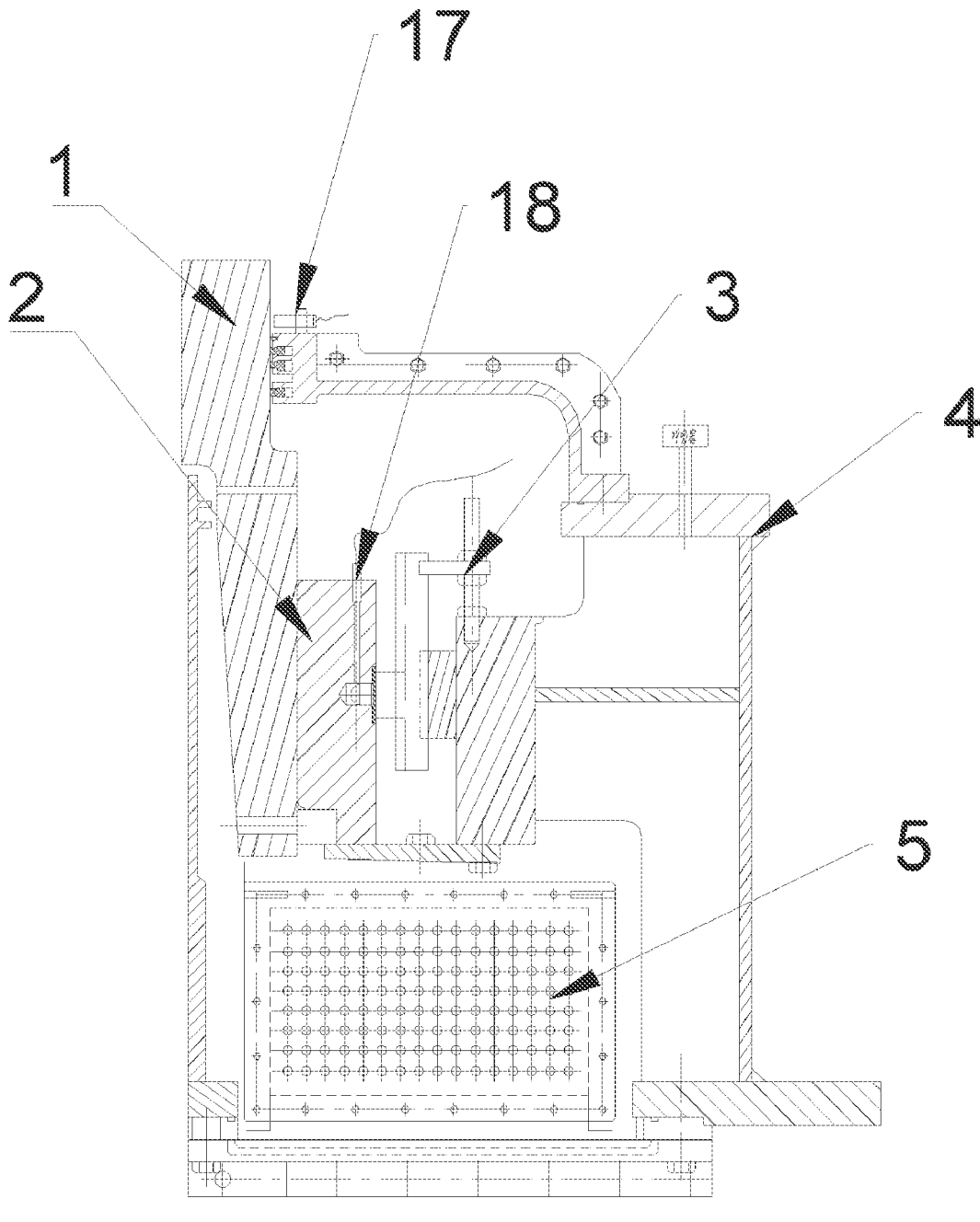
FIG. 1 is the structure diagram of a guide bearing in the embodiment.

In the drawings, 1—Rotating shaft collar, 2—Bearing bush, 3—Bush adjusting structure, 4—Bearing oil basin body, 5—Cooler, 6—Bearing bush, 7—Generator shaft, 8—Generator thrust bearing, 9—Generator upper guide bearing, 10—Generator upper rack, 11—Generator rotor, 12—Generator lower rack, 13—Generator lower guide bearing, 14—Rotating shaft, 15—Hydroturbine water guide bearing, 16—Hydroturbine runner, 17—Swing displacement sensor, 18—Temperature sensor.

EMBODIMENTS

The technical proposals in the embodiments are clearly and completely described in combination with the drawings to the embodiments of the application. Obviously, the embodiments described are only part of the embodiments of the application, but not all embodiments. Based on the embodiments, all other embodiments obtained by the ordinary technicians in the field without creative labor fall within the scope of protection of the application.

Unless otherwise defined, technical or scientific terms used in the embodiments of the application should have ordinary meanings understood by persons with general skills in their respective fields. "first", "second", and similar words used in the embodiments do not indicate any order, quantity, or importance, but distinguish between different components. Similar words such as "comprise" or "include" mean that the component or object appearing before the word covers the component or object listed after the word and its equivalent, and do exclude other components or objects. "installed", "connected together", and "connected" should be understood in a broad sense, for example, fixedly connected, or detachably connected, or integrally connected; or directly connected, or indirectly connected through an intermediate medium, or connected within two components. "upper", "lower", "left", "right", "horizontal", "vertical", etc. are used only with respect to the orientation of the parts in the drawings. These directional terms are relative concepts, which are used for the relative description and clarification and can change with the orientation of the parts in the drawings.

Embodiment 1

Figure 4:
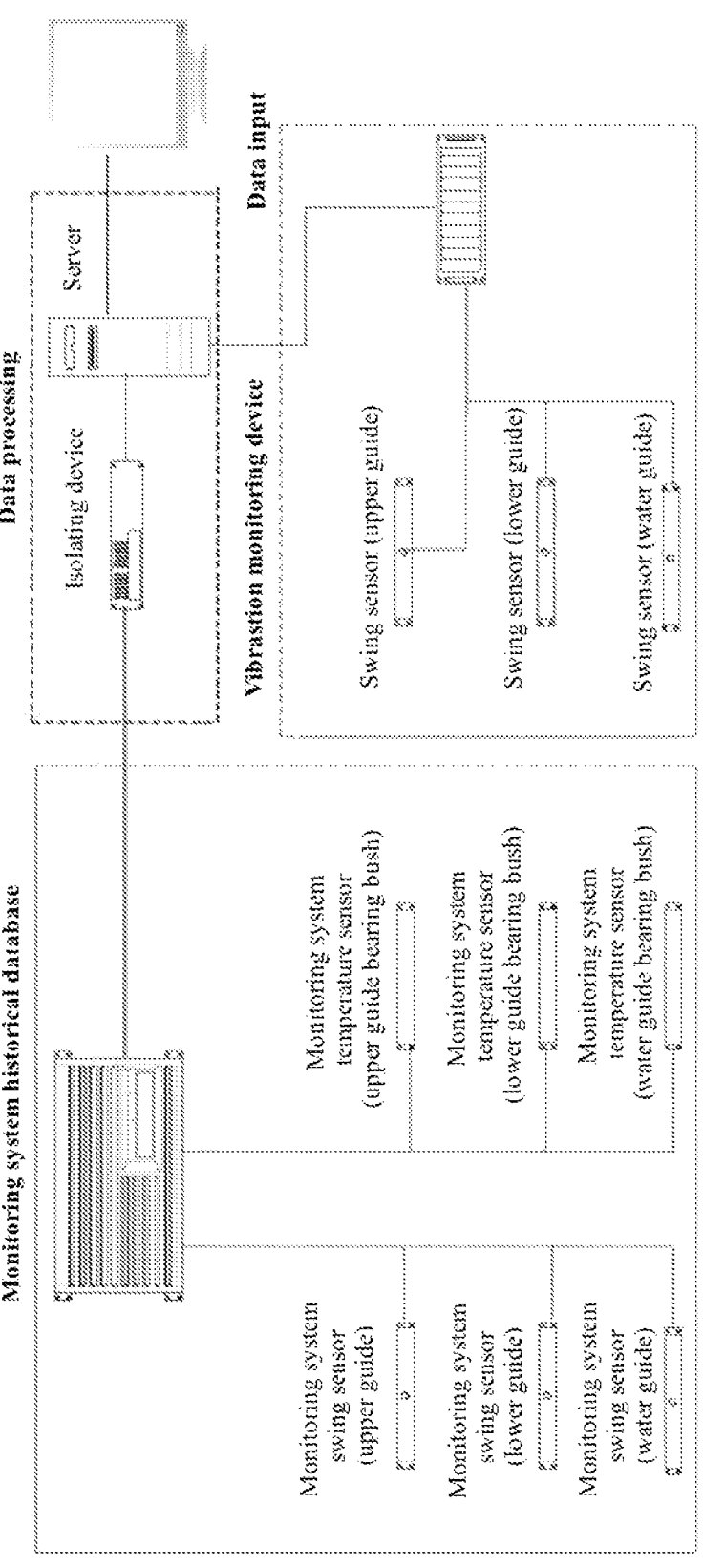
FIG. 4 is the block diagram of the system in the embodiment.

As shown in FIG. 4, a system for optimizing operating swing of a vertical shaft suspended hydrogenerator unit in the embodiment comprises a data acquisition terminal, a processing terminal and an input terminal.

The data acquisition terminal comprises two data acquisition ports: monitoring system historical database and vibration monitoring device. The data processing terminal comprises an isolation device from a monitoring system and a data processing server. The data input terminal mainly refers to a mobile laptop.

The monitoring system historical database includes swing sensor data of the monitoring system for an upper guide, a lower guide and a water guide, as well as temperature sensor data of the monitoring system for an upper guide bearing bush, a lower guide bearing bush and a water guide bearing bush. The vibration monitoring device is connected to a swing sensor of the monitoring system for the upper guide, the lower guide and the water guide.

The turning swing data of the unit is entered into the system through the data input terminal based on the final data record of the unit axis adjustment during the unit overhaul. The method for optimizing operating swing of the vertical shaft suspended hydrogenerator unit in the embodiment is implemented as follows:

As shown in FIG. 1, a suspended unit comprises a rotating shaft collar 1, a bearing bush 2, a bush adjusting structure 3, a bearing oil basin body 4 and a cooler 5, upper and lower guide bearings are respectively provided with 12 bushes, including 8 thrust bushes which are partitioned, and 4 water guide bushes which adopt the cylinder structure, routine C-level maintenance is carried out, and the relevant pre-maintenance data statistics are as follows:

TABLE 1

| | Thrust bearing | Upper guide bearing | | Lower guide bearing | | Water guide bearing | | | | |
|---|---|---|---|---|---|---|---|---|---|---|
| No. | Bush temperature | Bush temperature | Bush clearance | Bush temperature | Bush clearance | Bush temperature | Bush clearance | Item | Operating swing | Turning swing |
| 1# | 45.3 | 54.7 | 0.171 | 55.3 | 0.150 | 58.6 | 0.24 | Upper guide X | 0.153 | 0.01 |
| 2# | 44.1 | 54.7 | 0.171 | 57.3 | 0.160 | 59.1 | 0.28 | Upper guide Y | 0.147 | |

Pre-maintenance Data Record Sheet of Embodiment 1

TABLE 1-continued

Pre-maintenance Data Record Sheet of Embodiment 1

| No. | Thrust bearing Bush temperature | Upper guide bearing | | Lower guide bearing | | Water guide bearing | | Item | Operating swing | Turning swing |
|---|---|---|---|---|---|---|---|---|---|---|
| | | Bush temperature | Bush clearance | Bush temperature | Bush clearance | Bush temperature | Bush clearance | | | |
| 3# | 44.3 | 53.2 | 0.169 | 54.5 | 0.160 | 56.6 | 0.22 | Lower guide X | 0.175 | 0.05 ∠ 315 |
| 4# | 44.6 | 53.7 | 0.169 | 55.2 | 0.180 | 57.8 | 0.26 | Lower guide Y | 0.170 | |
| 5# | 45.2 | 53.5 | 0.170 | 61.2 | 0.181 | | | Water guide X | 0.112 | 0.04 ∠ 45 |
| 6# | 45.1 | 54.7 | 0.170 | 60.9 | 0.181 | | | Water guide Y | 0.123 | |
| 7# | 44.6 | 53.4 | 0.170 | 58.4 | 0.140 | | | | | |
| 8# | 44.9 | 53.0 | 0.170 | 63.7 | 0.182 | | | | | |
| 9# | | 51.8 | 0.170 | 63.8 | 0.160 | | | | | |
| 10# | | 53.0 | 0.170 | 62.7 | 0.161 | | | | | |
| 11# | | 53.8 | 0.170 | 58.8 | 0.160 | | | | | |
| 12# | | 55.6 | 0.170 | 55.4 | 0.160 | | | | | |

Remarks:
1. The design requirement of the unilateral clearance for the upper and lower guide bearing bushes of the generator is 0.15-0.20 mm;
2. The design requirement of the unilateral clearance for the water guide bearing bush of the hydroturbine is 0.195-0.535 mm;
3. The method of holding the upper guide bearing bush is adopted during turning;
4. Unit of bush temperature: ° C.;
5. Unit of swing and bush clearance: mm.

Step (1) The turning data is obtained during the unit overhaul. Hold the upper guide bearing bush tightly during turning, measure the maximum absolute swing and direction of the lower guide bearing and the water guide bearing, then adjust the bush clearance according to the turning data, and record the bush temperature and swing after starting the unit;

Turning is a conventional measuring means during unit overhaul. In the static state of the unit, set up the dial indicator, vertically point the dial head to each guide bearing collar and set to zero (the large pointer points to 0, and the small pointer is in the middle range of the dial indicator), and the reading is 0; during turning, stop when rotating a certain point of the part to a fixed measuring point (a total of 8 measuring points evenly distributed), and the reading of the dial indicator is the measured value of the lower guide bearing part; +0.01 mm displayed indicates that the lower guide bearing collar moves by 0.01 mm to the position of the setup position; −0.01 mm indicates that the lower guide bearing collar moves by 0.01 mm to the opposite position of the setup position.

Adjusting the bush clearance is a conventional adjustment method for unit maintenance. In the fixed state when the unit center adjustment is completed, tighten the upper and lower bearing bushes, and calculate the bush clearance by raising the height of the wedge plate (1:70).

Preassemble and trim the cylindrical water guide bearing bush during the unit installation due to the structure limit, slightly adjust the base connecting bolt in the state when the unit center adjustment is completed, and measure the bush clearance.

Figure 2:
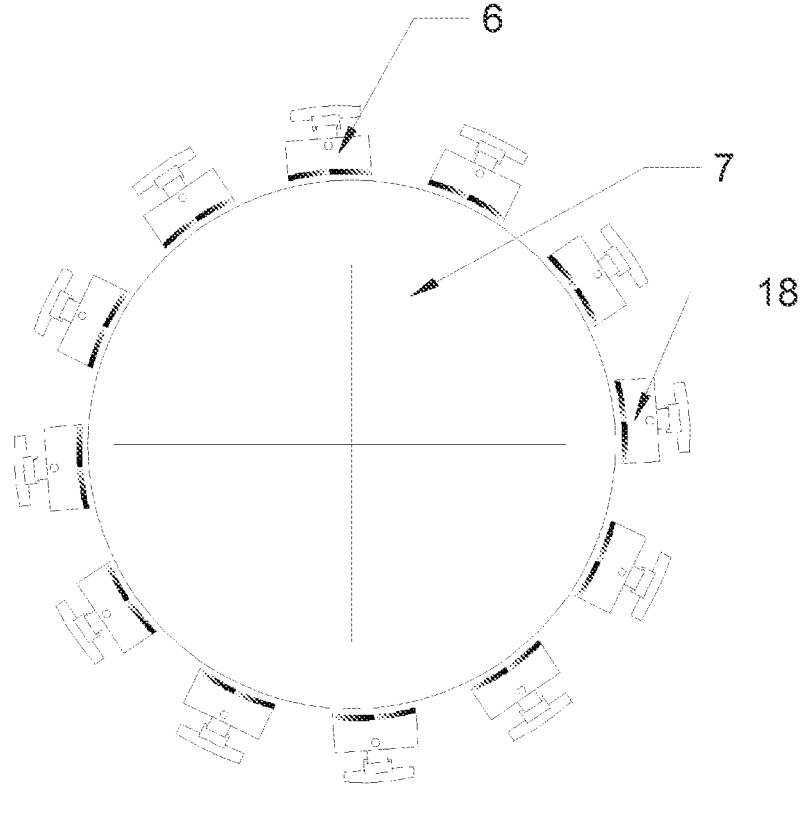
FIG. 2 is the layout structure diagram of a guide bearing bush in the embodiment.

As shown in FIG. 2, the bearing bush 6 is arranged on the rotating shaft 7, and 12 upper and lower guide bearings are evenly distributed. When other known conditions remain unchanged, the bush temperature is inversely proportional to the bush clearance; the bush temperature is higher when the bush clearance is smaller. The analysis of bush temperature shows that the rotating center is closer to the lower guide bearing bushes 8 and 9.

Figure 3:
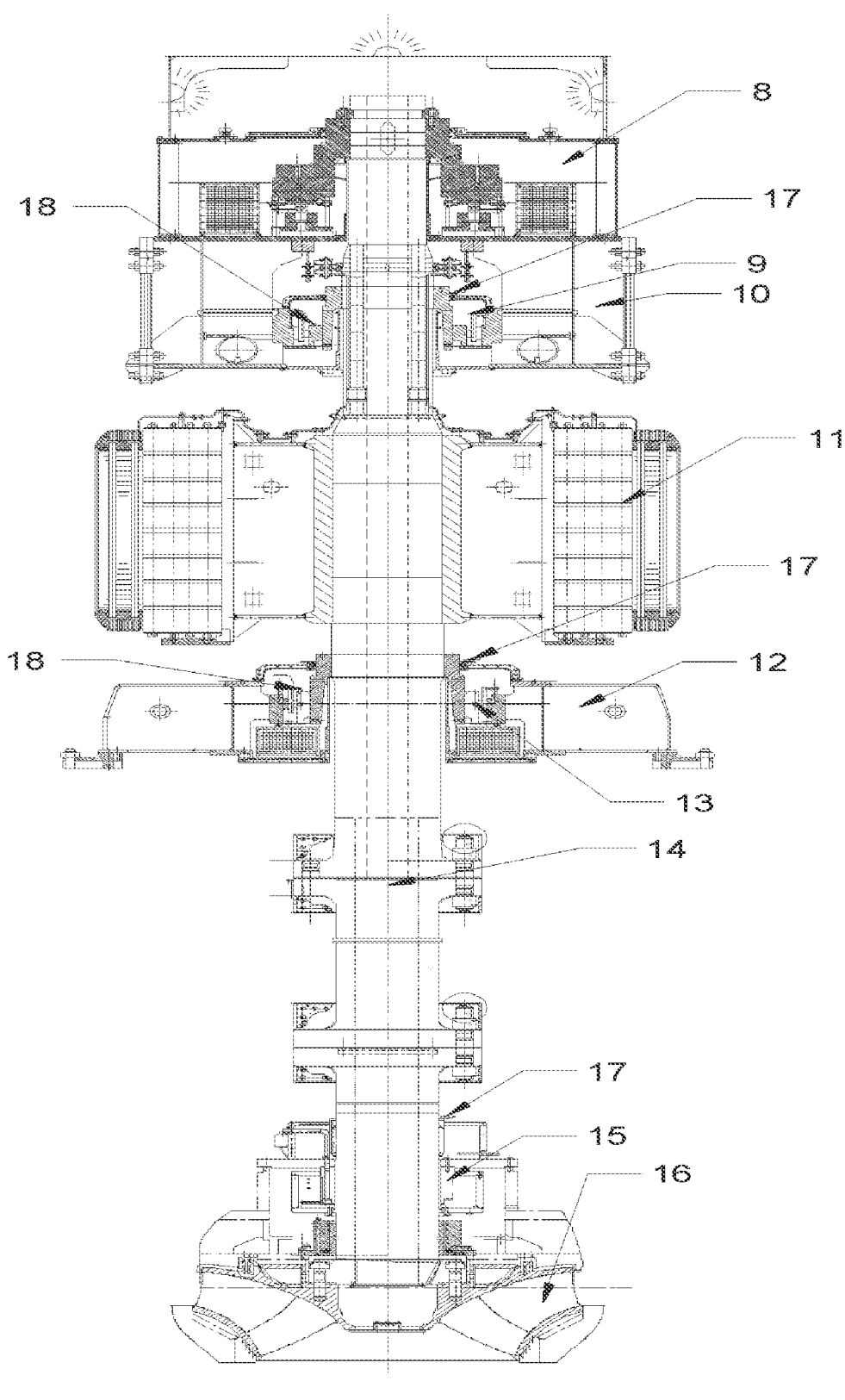
FIG. 3 is the structural diagram of a vertical shaft suspended hydrogenerator unit in the embodiment.

As shown in FIG. 3, a suspended unit adopts the following structural form: the rotating shaft 7 and the thrust bearing 8 of the generator are located above the unit, the upper guide bearing 9 of the generator is arranged in the upper rack 10 of the generator, the lower guide bearing 13 of the generator is arranged in the lower rack 12 of the generator, the generator rotor 11 and the hydroturbine runner 16 are connected through the multi-section rotating shaft of the unit, the water guide bearing of the hydroturbine adopts a cylindrical structure, the generator rotor 11 is affected by the electromagnetic unbalanced force during the unit operation, and the hydroturbine runner 16 is affected by the hydraulic unbalanced force. The multi-direction swing sensors 17 are arranged at the oil basin cover positions of the upper, lower and water guide bearings, and the temperature sensor 18 is arranged in each guide bearing bush.

Step (2) Set the target value of the operating swing according to the operating swing requirements of the superior company for creating excellent units: the upper guide swing (X/Y) is less than or equal to 100 µm, the lower guide swing (X/Y) is less than or equal to 120 µm, and the water guide swing (X/Y) is less than or equal to 100 µm. The operating swing value is much higher than the turning swing value. Based on the dynamic balance test of the unit, the relevant operating data meet the standard requirements. The unit is less affected by electromagnetic and hydraulic unbalanced forces, and the operating swing measured by the sensor is not synchronized with the rotation period. It is considered that the horizontal displacement of the rotating shaft is the main reason that affects the operating swing value of the unit. The binding forces of the upper and water guide bearing bushes are small, which do not limit the horizontal displacement of the rotating shaft.

In addition, the design alarm value for the bearing bush of the unit is 70 degrees C. The bush temperature operation data of the unit over the years shows that the lower guide bearing bush temperature is generally high, the maximum value is about 64 degrees C., so there is enough design safety redundancy; the turning swing is less than the operating swing, so it is possible to reduce the bush clearance (beyond the design range). Giving overall consideration of the design safety redundancy and according to the maximum value of the operating data over the years, the operating temperature target value of the upper and lower guide bearing bushes is set to 64 degrees C., and the adjustment scheme is as follows:

TABLE 2

| | | First Adjustment Scheme of Embodiment 1 | | | | | |
| | | Upper guide bearing | | | Lower guide bearing | | |
| No. | Target value of bush temperature | Bush clearance | Adjustment scheme of bush clearance | Initial value of bush temperature | Initial value of bush clearance | Adjustment scheme of bush clearance | Initial value of bush clearance |
|---|---|---|---|---|---|---|---|
| 1# | 64 | 0.171 | −0.030 | 54.7 | 0.15 | −0.110 | 55.3 |
| 2# | | 0.171 | −0.030 | 54.7 | 0.16 | −0.085 | 57.3 |
| 3# | | 0.169 | −0.041 | 53.2 | 0.16 | −0.089 | 54.5 |
| 4# | | 0.169 | −0.040 | 53.7 | 0.18 | −0.079 | 55.2 |
| 5# | | 0.170 | −0.020 | 53.5 | 0.181 | −0.020 | 61.2 |
| 6# | | 0.170 | −0.020 | 54.7 | 0.181 | | 60.9 |
| 7# | | 0.170 | −0.020 | 53.4 | 0.14 | −0.030 | 58.4 |
| 8# | | 0.170 | −0.030 | 53.0 | 0.182 | | 63.7 |
| 9# | | 0.170 | −0.020 | 51.8 | 0.16 | | 63.8 |
| 10# | | 0.170 | −0.020 | 53.0 | 0.161 | | 62.7 |
| 11# | | 0.170 | −0.020 | 53.8 | 0.16 | −0.049 | 58.8 |
| 12# | | 0.170 | −0.020 | 55.6 | 0.16 | −0.101 | 55.4 |

Remarks:

1. Unit of bush temperature: ° C.;

2. Unit of swing and bush clearance: mm;

3. The empirical values of the bush temperature and clearance vary with the unit structure and the hydraulic characteristics.

(2) After adjusting the clearance between the upper and lower guide bearing bushes according to the above scheme, carry out the temperature rise test of the unit and record the operating parameters. The results are as follows:

TABLE 3

| | | First Adjustment Results of Embodiment 1 | | | | | |
| No. | Target value of bush temperature | Upper guide bearing Actual value of bush temperature | Lower guide bearing Actual value of bush temperature | Item | Operating swing Initial value | Operating swing Actual value |
|---|---|---|---|---|---|---|
| 1# | 64 | 58.8 | 62.5 | Upper guide X | 0.153 | 0.88 |
| 2# | | 57.5 | 63.2 | Upper guide Y | 0.147 | 0.84 |
| 3# | | 58.8 | 63.6 | Lower guide X | 0.175 | 0.151 |
| 4# | | 59.2 | 62.8 | Lower guide Y | 0.170 | 0.145 |
| 5# | | 59.6 | 64.8 | Water guide X | 0.112 | 0.094 |
| 6# | | 58.8 | 64.7 | Water guide Y | 0.123 | 0.104 |
| 7# | | 59.8 | 62.7 | | | |
| 8# | | 60.5 | 64.2 | | | |
| 9# | | 60.1 | 64.7 | | | |
| 10# | | 61.1 | 64.3 | | | |
| 11# | | 58.9 | 64.5 | | | |
| 12# | | 61.3 | 62.4 | | | |

Remarks:

1. Unit of bush temperature: ° C.;

2. Unit of swing and bush clearance: mm;

According to the bush temperature data from the temperature rise test, the upper guide bearing bush has the possibility of further convergence, and the lower guide bearing bush has small adjustment margin. Correct the clearance of each bearing bush according to the target value for the set operating temperature of the bearing bush, and repeat the above steps several times until the operating temperature of the bearing bush reaches the target value or the operating swing meets the requirements of the superior company for creating excellent units. The final results are as follows:

TABLE 4

Final Adjustment Results of Embodiment 1

| No. | Target value of bush temperature | Upper guide bearing Actual value of bush temperature | Lower guide bearing Actual value of bush temperature | Item | Operating swing Initial value | Operating swing Target value | Actual value |
|---|---|---|---|---|---|---|---|
| 1# | 64 | 62.6 | 63.0 | Upper guide X | 0.153 | ≤100 μm | 0.049 |
| 2# | | 62.2 | 61.8 | Upper guide Y | 0.147 | | 0.044 |
| 3# | | 63.0 | 63.3 | Lower guide X | 0.175 | ≤120 μm | 0.122 |
| 4# | | 61.3 | 64.0 | Lower guide Y | 0.170 | | 0.114 |
| 5# | | 61.8 | 63.9 | Water guide X | 0.112 | ≤100 μm | 0.055 |
| 6# | | 62.1 | 63.0 | Water guide Y | 0.123 | | 0.056 |
| 7# | | 60.6 | 64.5 | | | | |
| 8# | | 59.2 | 64.0 | | | | |
| 9# | | 61.4 | 64.2 | | | | |
| 10# | | 63.0 | 64.5 | | | | |
| 11# | | 59.9 | 62.3 | | | | |
| 12# | | 63.8 | 63.2 | | | | |

Remarks:
1. Unit of bush temperature: ° C.;
2. Unit of swing and bush clearance: mm;

It can be concluded from the results that the operating swing is obviously small, and the method in the embodiment is feasible.

Embodiment 2

The routine C-level maintenance is carried out on a suspended unit carries out, and the relevant pre-maintenance data statistics are as follows:

(2) From the operating data analysis, the bush temperature of each bearing is generally small, and the operating swing of the unit is small, but the upper guide swing does not meet and reach the target value. Like Embodiment 1, set the operating temperature target value of the upper and lower guide bearing bushes to 64±1 degrees C., the upper guide swing (X/Y) to be less than or equal to 100 μm, the lower guide swing (X/Y) to be less than or equal to 120 μm and the water guide swing (X/Y) to be less than or equal to 100 μm,

TABLE 5

Pre-maintenance Data Record Sheet of Embodiment 2

| No. | Thrust bearing Bush temperature | Upper guide bearing Bush temperature | Upper guide bearing Bush clearance | Lower guide bearing Bush temperature | Lower guide bearing Bush clearance | Water guide bearing Bush temperature | Water guide bearing Bush clearance | Item | Operating swing | Turning swing |
|---|---|---|---|---|---|---|---|---|---|---|
| 1# | 47.0 | 56.7 | 0.170 | 59.9 | 0.170 | 51.7 | 0.20 | Upper guide X | 0.151 | 0.02 |
| 2# | 46.7 | 57.2 | 0.170 | 58.2 | 0.170 | 54.7 | 0.20 | Upper guide Y | 0.150 | |
| 3# | 46.9 | 60.0 | 0.170 | 58.6 | 0.170 | 55.4 | 0.20 | Lower guide X | 0.116 | 0.03 ∠ 90 |
| 4# | 46.5 | 59.8 | 0.170 | 52.5 | 0.170 | 54.7 | 0.20 | Lower guide Y | 0.104 | |
| 5# | 47.1 | 63.6 | 0.170 | 55.5 | 0.170 | | | Water guide X | 0.042 | 0.04 ∠ 270 |
| 6# | 46.7 | 56.9 | 0.170 | 55.6 | 0.170 | | | Water guide Y | 0.063 | |
| 7# | 48.0 | 59.7 | 0.170 | 59.3 | 0.170 | | | | | |
| 8# | 46.7 | 58.9 | 0.170 | 59.0 | 0.170 | | | | | |
| 9# | | 59.0 | 0.170 | 57.3 | 0.170 | | | | | |
| 10# | | 60.5 | 0.170 | 57.2 | 0.170 | | | | | |
| 11# | | 58.7 | 0.170 | 57.3 | 0.170 | | | | | |
| 12# | | 60.9 | 0.170 | 57.3 | 0.170 | | | | | |

Remarks:
1. The design requirement of the unilateral clearance for the upper and lower guide bearing bushes of the generator is 0.15-0.20 mm;
2. The design requirement of the unilateral clearance for the water guide bearing bush of the hydroturbine is 0.195-0.535 mm;
3. The method of holding the upper guide bearing bush is adopted during turning;
4. Unit of bush temperature: ° C.;
5. Unit of swing and bush clearance: mm.

adjust the bush clearance for several times according to the empirical values of the bush temperature and the bush clearance, and break through the design value of the bush clearance. The final results are as follows:

TABLE 6

| | | Upper guide bearing Actual | Lower guide bearing Actual | | Operating swing | Operating swing | |
| No. | Target value of bush temperature | value of bush temperature | value of bush temperature | Item | Initial value | Target value | Actual value |
| --- | --- | --- | --- | --- | --- | --- | --- |
| Final Adjustment Results of Embodiment 2 | | | | | | | |
| 1# | 64 | 57.5 | 63.3 | Upper guide X | 0.151 | ≤100 µm | 0.051 |
| 2# | | 56.7 | 61.7 | Upper guide Y | 0.150 | | 0.040 |
| 3# | | 56.9 | 61.5 | Lower guide X | 0.116 | ≤120 µm | 0.105 |
| 4# | | 58.9 | 60.7 | Lower guide Y | 0.104 | | 0.090 |
| 5# | | 56.8 | 60.1 | Water guide X | 0.042 | ≤100 µm | 0.041 |
| 6# | | 57.8 | 61.8 | Water guide Y | 0.063 | | 0.061 |
| 7# | | 58.0 | 63.5 | | | | |
| 8# | | 56.9 | 62.4 | | | | |
| 9# | | 57.8 | 62.6 | | | | |
| 10# | | 59.5 | 63.2 | | | | |
| 11# | | 57.1 | 63.4 | | | | |
| 12# | | 66.8 | 63.9 | | | | |

Remarks:
3. Unit of bush temperature: ° C.;
4. Unit of swing and bush clearance: mm.

It can be seen from the final results that the method of the invention can further confirm and judge the impact factors affecting the operating swing of the unit, and effectively reduces the operating swing of the unit by improving the turning accuracy of the unit, exceeding the design standard of the bush clearance and increasing the binding force of the bearing bush, so the method of the invention is indeed effective, accurate and reliable. The above embodiments are only preferred embodiments of the invention and are not intended to limit the invention. Any modification, equivalent replacement, improvement, etc. made within the spirit and principles of the invention should fall within the scope of protection of the invention.

The invention claimed is:

1. A method for optimizing operating swing of a vertical shaft suspended hydrogenerator unit, characterized by including the following steps:

Step (1) Collect turning swing data of the unit before maintenance or restart turning of the unit during maintenance and collect the data, and calculate direction of relative displacement between a rotating center of each bearing for the unit and a center line of a main shaft;

Step (2) Measure an installation clearance of each bearing bush during maintenance; in case of no change or small change, structural strength of the bearing is considered to be acceptable, installation is considered to be firm and reliable;

Detect temperature of each bearing bush as well as oil level and temperature of the bearing before maintenance, adjust bush clearance during maintenance according to a design value, start the unit to perform a temperature rise test, and record the operating swing of the unit, the temperature of each bearing bush, the oil level and temperature of the bearing, and a temperature difference of the cooling water; calculate the margin of the design value for the operating temperature of the bearing bush through the comparison of the data before and after maintenance, and analyze whether the bush clearance can be reduced beyond a design range;

If feasible, set a target value of the operating temperature of the bearing bush, and reduce the clearance of each bearing bush according to the direction of the relative displacement between the rotating center of the bearing and the center line of the main shaft calculated in Step (1);

Reduce the clearance of each bearing bush, and automatically calculate clearance reduction of each bush by a weighted average method according to a ratio of bush clearance variation to bush temperature difference during maintenance and bush adjustment of all units;

Step (3) Carry out the temperature rise test of the unit again, record the operating swing of the unit and the temperature of each bearing bush, and correct the clearance of each bearing bush again according to the target value of the operating temperature of the bearing bush;

Step (4) Repeat Step (3) until the operating temperature of the bearing bush reaches the target value and a temperature deviation of the bearing bush does not exceed 5 degrees C.;

Step (5) Carry out a stability qualitative test of the unit, record the operating temperature of the bearing bush and the operating swing of the unit, compare pre-maintenance data of the unit, and constantly optimize, so that an optimized value of the operating swing can reach an expected value and the operating temperature of the bearing bush can reach the target value.

2. The method according to claim 1, characterized in that in Step (1), the collected data are the pre-maintenance temperature of each bearing bush of each guide bearing and the bush clearance during installation.

3. The method according to claim 1, characterized in that in Step (1), axis adjustment accuracy of the unit is less than 0.01 mm/m when the unit is overhauled.

4. The method according to claim 1, characterized in that in Step (2), the target value of the operating temperature of the bearing bush is set according to the standard requirements, including design value safety redundancy and operating procedure.

5. The method according to claim 1, characterized in that in Step (5), if the optimized value of the operating swing does not reach the expected value, reduce the operating temperature of the bearing bush, and implement Step (3) again to make the optimized value of the operating swing reach the expected value and the operating temperature of the bearing bush reach the target value; the ways to reduce the operating temperature of the bearing bush include increasing the bearing oil level and increasing the cooling water flow.

6. The method according to claim 1, characterized in that in Step (5), if the optimized value of the operating swing is degraded after a stability test of the unit is performed, such as load dump test or overspeed test, implement Steps (3) and (4) again.

7. A system for optimizing operating swing of a vertical shaft suspended hydrogenerator unit, characterized by comprising a data acquisition terminal, a processing terminal and an input terminal;

The acquisition terminal collects turning swing data of the unit before maintenance, or collects the data when turning of the unit is carried out again during maintenance, and the processing terminal calculates a direction of relative displacement between a rotating center of each bearing for the unit and a center line of the main shaft;

Measure an installation clearance of each bearing bush for a guide bearing during maintenance; after inputting through the input terminal, the processing terminal analyzes a change value of the bush clearance of the unit within an operating cycle; in case of no change value or if the change value is less than 0.01 mm, structural strength of the bearing is judged to be acceptable, and installation is considered to be firm and reliable;

Detect temperature of each bearing bush as well as oil level and temperature of the bearing before maintenance, adjust bush clearance according to a design value, start the unit to perform a temperature rise test, and record the operating swing of the unit, the temperature of each bearing bush, the oil level and temperature of the bearing, and input through the input terminal; the processing terminal calculates margin between the operating temperature of the bearing bush and the design value, and analyzes whether the bush clearance can be reduced beyond a design range;

If feasible, a target value of the operating temperature of the bearing bush is set through the input terminal, and the processing terminal reduces the clearance of each bearing bush according to the direction of relative displacement between the rotating center of the bearing and the center line of the main shaft analyzed according to Step (1), and clearance reduction of each bush is automatically calculated by a weighted average method according to a ratio of bush clearance variation to bush temperature difference during maintenance and bush adjustment of all units;

Carry out a temperature rise test of the unit, input the operating swing of the unit and the temperature of each bearing bush through the input terminal, and correct the clearance of each bearing bush again according to the target value of the operating temperature of the bearing bush at the processing terminal, repeat until the operating temperature of the bearing bush reaches the target value and a temperature deviation of the bearing bush does not exceed 5 degrees C.;

Carry out a stability qualitative test of the unit, input the operating temperature of the bushing bush and the operating swing of the unit through the input terminal, and the processing terminal compares the pre-maintenance data of the unit and constantly optimizes, so that an optimized value of the operating swing can reach an expected value and the operating temperature of the bearing bush can reach the target value.

8. The system according to claim 7, characterized in that the system also comprises a display terminal, which displays final processing results of the optimized value of the operating swing and the operating temperature of the bearing bush.

\* \* \* \* \*